United States Patent
Kim

(10) Patent No.: US 9,972,659 B2
(45) Date of Patent: May 15, 2018

(54) ELECTRONIC DEVICE AND METHOD FOR FABRICATING THE SAME

(71) Applicant: SK hynix Inc., Icheon-Si (KR)

(72) Inventor: Chi-Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days. days.

(21) Appl. No.: 15/163,069

(22) Filed: May 24, 2016

(65) Prior Publication Data
US 2017/0194378 A1    Jul. 6, 2017

(30) Foreign Application Priority Data

Dec. 30, 2015   (KR) .................. 10-2015-0189272

(51) Int. Cl.
| | |
|---|---|
| H01L 27/22 | (2006.01) |
| H01L 29/423 | (2006.01) |
| G06F 12/084 | (2016.01) |
| G06F 13/16 | (2006.01) |
| G06F 13/42 | (2006.01) |
| H01L 27/24 | (2006.01) |
| H01L 29/10 | (2006.01) |
| H01L 29/167 | (2006.01) |
| H01L 29/49 | (2006.01) |
| H01L 29/51 | (2006.01) |
| H01L 43/02 | (2006.01) |
| H01L 43/08 | (2006.01) |
| H01L 45/00 | (2006.01) |

(52) U.S. Cl.
CPC .......... *H01L 27/228* (2013.01); *G06F 12/084* (2013.01); *G06F 13/1673* (2013.01); *G06F 13/4282* (2013.01); *H01L 27/2436* (2013.01); *H01L 29/1095* (2013.01); *H01L 29/167* (2013.01); *H01L 29/4236* (2013.01); *H01L 29/495* (2013.01); *H01L 29/517* (2013.01); *H01L 43/02* (2013.01); *H01L 43/08* (2013.01); *H01L 45/1206* (2013.01); *H01L 45/1226* (2013.01); *G06F 2212/314* (2013.01)

(58) Field of Classification Search
CPC ............ H01L 29/4236; H01L 29/1095; H01L 27/228; H01L 27/2436
See application file for complete search history.

(56) References Cited

U.S. PATENT DOCUMENTS

| | | | | |
|---|---|---|---|---|
| 9,171,847 | B1 * | 10/2015 | Lee | .............. H01L 27/10823 |
| 2007/0228435 | A1 * | 10/2007 | Ho | .............. H01L 27/10876 257/296 |
| 2009/0267125 | A1 * | 10/2009 | Mikasa | .......... H01L 21/823481 257/300 |
| 2014/0159145 | A1 | 6/2014 | Park et al. | |
| 2016/0233333 | A1 * | 8/2016 | Toh | .......... H01L 43/12 |

* cited by examiner

*Primary Examiner* — Allison P Bernstein
(74) *Attorney, Agent, or Firm* — Perkins Coie LLP

(57) ABSTRACT

An electronic device may include a semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench.

19 Claims, 9 Drawing Sheets

ELECTRONIC DEVICE AND METHOD FOR FABRICATING THE SAME

CROSS-REFERENCE TO RELATED APPLICATION

The present application claims priority of Korean Patent Application No. 10-2015-0189272, entitled "ELECTRONIC DEVICE AND METHOD FOR FABRICATING THE SAME" and filed on Dec. 30, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device with improved characteristics, and associated fabrication of such devices.

In an implementation, an electronic device may include a semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench.

The diffusion region may include dopants of the same materials as the dopants contained in the gate electrode. The diffusion region may include diffused dopants through diffusion of the dopants contained in the gate electrode into the substrate. The gate electrode may include tungsten doped with dopants containing boron. The diffusion region may include the boron.

Also, in an implementation, the electronic device may further include a diffusion barrier layer interposed between the gate dielectric layer and the gate electrode. The diffusion barrier layer may have a columnar structure. The diffusion barrier layer may include a titanium nitride layer or a tungsten nitride layer.

The junction regions may include a part that overlaps with a part of the gate electrode to a horizontal direction. The diffusion region may include a first region formed between the gate electrode and the junction regions, and a second region except for the first region. Conductivity types of the first region and the second region may be the same as each other, and a doping concentration of the second region may be greater than the doping concentration of the first region. The conductivity types of the first region and the second region may be different from each other, and the conductivity types of the first region and the junction regions may be the same as each other. The doping concentration of the first region may be less than the doping concentration of the junction regions. The memory element may include a variable resistance element which is switched between different resistance states in response to voltage or current applied thereto. The variable resistance element may include a magnetic tunnel junction in which a tunnel barrier is interposed between two magnetic materials. The variable resistance element may include a metal oxide material, a phase change material, or a ferroelectric material.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabrication of an electronic device may include selectively etching a substrate to form a trench; forming a gate dielectric layer on a surface of the trench; forming a gate electrode containing dopants which gap-fills a part of the trench on the gate dielectric layer; forming junction regions in the substrate at both sides of the trench; and forming a diffusion region by diffusing the dopants contained in the gate electrode into the substrate.

The gate electrode may include tungsten doped with dopants containing boron. The gate electrode may be formed by using diborane ($B_2H_6$) and tungsten hexafluoride ($WF_6$).

Also, in an implementation, a method for fabrication of an electronic device may further include forming a diffusion barrier layer on the gate dielectric layer before the gate electrode is formed. The diffusion barrier layer may be formed to have a columnar structure. The diffusion barrier layer may include a titanium nitride layer or a tungsten nitride layer.

DETAILED DESCRIPTION

Figure 1:
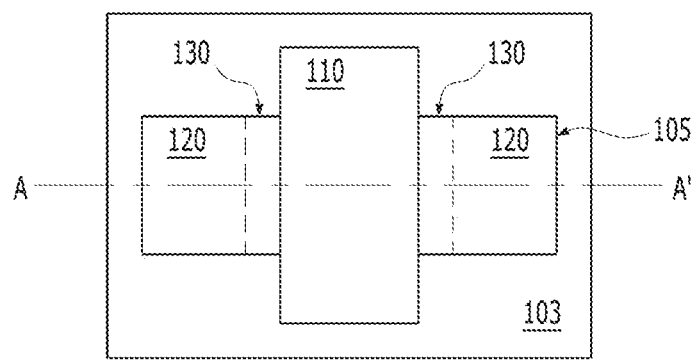
FIG. 1 is a plan view illustrating an example of a transistor in accordance with an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
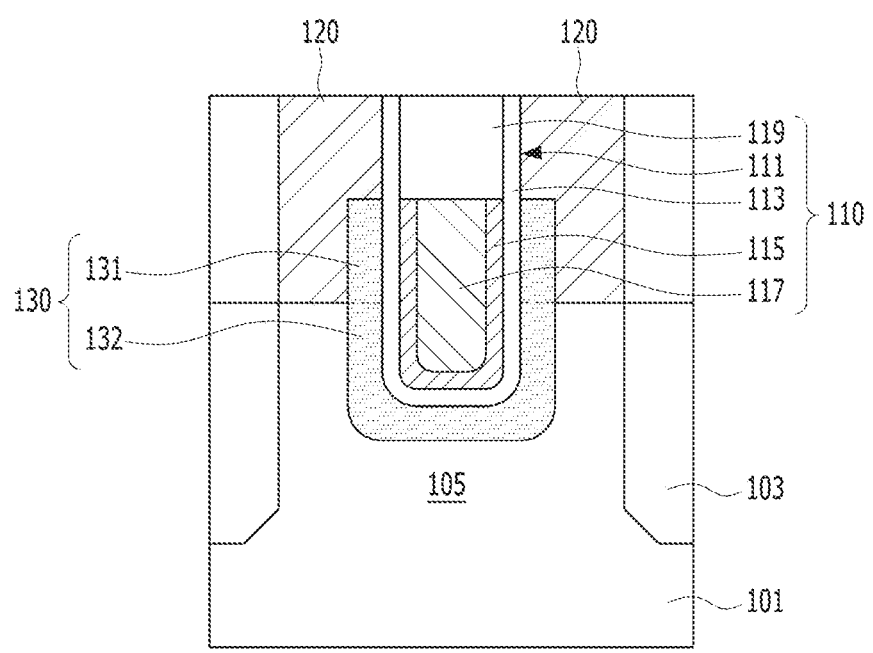
FIG. 2 is a cross-sectional view illustrating the transistor taken along line A-A' illustrated in FIG. 1.

FIG. 1 is a plan view illustrating an example of a transistor in accordance with an implementation of the disclosed technology, and FIG. 2 is a cross-sectional view illustrating the transistor taken along line A-A' illustrated in FIG. 1 in accordance with the implementation.

As illustrated in FIGS. 1 and 2, in the implementation, the transistor may include a buried-gate 110 of which at least a part is buried in a substrate 101, junction regions 120 which are formed in the substrate 101 at both sides of the buried-gate 110 to provide the drain and source regions for the transistor, and a diffusion region 130 which is formed in the substrate 101 to correspond to the buried-gate 110.

The components of the transistor in accordance with the implementation are described below in detail.

In the implementation, the transistor may include the substrate 101 and a field isolation layer 103 formed to define an active region 105 in the substrate 101 for forming the components 110, 120 and 130 of the transistor.

The substrate 101 may be a semiconductor substrate having a suitable crystalline structure such as a single crystal state, and may include silicon-containing materials. In some implementations, for example, the semiconductor substrate 101 may include a material selected from various single crystal silicon-containing materials. For example, the substrate 101 may be a single crystal bulk silicon substrate or a silicon on insulator (SOI) substrate in which a support substrate, a buried dielectric layer and a single crystal silicon layer are sequentially stacked.

The field isolation layer 103 which defines the active region 105 may be formed through a shallow trench isolation (STI) process. Therefore, the field isolation layer 103 may include a field isolation trench formed in the substrate 101 and a dielectric layer which is gap-filled in the field isolation trench. The dielectric layer may be a single-layered structure including any one of an oxide material, a nitride material, or an oxynitride material, or a multi-layered structure including two or more layers formed by the above materials. The active region 105 defined through the field isolation layer 103 may be a bar type or a line type having a long and short axes.

Also, in the illustrated implementation, a transistor may include a buried-gate 110 of which at least a part is buried in the substrate 101. The buried-gate 110 may be a structure having a form that a part of a gate structure or the whole gate structure is buried in the substrate 101. As shown in FIG. 2, the buried-gate 110 may include a trench 111 formed in the substrate 101, a gate dielectric layer 113 formed on a surface of the trench 111, a gate electrode 117 formed on the gate dielectric layer 113 to gap-fill a part of the trench, a diffusion barrier layer 115 interposed between the gate dielectric layer 113 and the gate electrode 117, and a sealing layer 119 which gap-fills the rest of the trench 111 on the gate electrode 117.

The trench 111 is for providing a space in which the buried-gate 110 is to be formed, and may have a form which simultaneously crosses the active region 105 and the field isolation layer 103 to the short axis direction of the active region 105. The depth of the trench 111 formed in the field isolation layer 103 may be the same as a depth of the trench 111 formed in the active region 105, or the depth of the trench 111 formed in the field isolation layer 103 may be larger than the depth of the trench 111 formed in the active region 105. When the depth of the trench 111 formed in the field isolation layer 103 is larger than the depth of the trench 111 formed in the active region 105, the active region 105 formed below the buried-gate 110 may have a fin structure.

The gate dielectric layer 113 may be formed on the entire surface of the trench 111 or may be formed only the surface of the trench 111 corresponding to the gate electrode 117. The gate dielectric layer 113 may be a single-layered structure including an oxide material, a nitride material, or an oxynitride material, or a multi-layered structure including two or more layers formed by the above materials.

The gate electrode 117 may include a conductive material containing dopants. The dopants contained in the gate electrode 117 may serve to reduce a resistance of the gate electrode 117, and to form a diffusion region 130. For example, the gate electrode 117 may include tungsten containing boron. Or, the gate electrode 117 is formed by tungsten and is doped with boron. In other words, the gate electrode 117 may include tungsten mixed with boron, and the boron mixed in the tungsten may reduce a resistance of the tungsten by increasing a grain size of the tungsten. The diffusion region 130 corresponding to the gate electrode 117 may be formed in the substrate 101 by diffusing the boron contained in the tungsten into the substrate 101. Since the diffusion region 130 is formed diffusion of the dopants contained in the gate electrode 117 as a source, the diffusion region 130 may have a form to surround an outer wall of the gate electrode 117.

The diffusion barrier layer 115 may be formed on or over gate dielectric layer 113. The diffusion barrier layer 115 may be formed over the entire of the trench surface 111 or may be formed only over the surface of the trench 111 corresponding to the gate electrode 117. The diffusion barrier layer 115 may serve to improve interface characteristics between the gate electrode 117 and the gate dielectric layer 113. Also, the diffusion barrier layer 115 may serve to control the amount of diffusion of the dopants when the dopants contained in the gate electrode 117 are diffused into the substrate to form the diffusion region 130. During the fabrication, the amount of diffusion of the dopants may be controlled through selection of a material for the diffusion barrier layer 115, a thickness, film quality or a crystal structure of the diffusion barrier layer 115. For example, the diffusion barrier layer 115 may include a titanium nitride layer or a tungsten nitride layer, and the crystal structure may be a columnar structure. This is because the dopant diffusion of the gate electrode 117 is easy through a grain boundary of the columnar structure, and the amount of dopant diffusion is easily increased as the grain size is reduced.

The sealing layer 119 may be for protecting the gate electrode 117, and may include dielectric materials. For example, the sealing layer 119 may be a single-layered structure including an oxide material, a nitride material, or an oxynitride material or a multi-layered structure including two or more layers formed of the above materials.

In implementations, the transistor may include the junction regions 120 formed in the substrate 101 at both sides of the buried-gate 110. The junction regions 120 may be a source region and a drain region. The junction regions 120 may overlap a part of the gate electrode 117 to a horizontal direction. That is, a bottom surface of the junction regions 120 may be located to be lower than an upper surface of the gate electrode 117 on the basis of a surface of the substrate 101. The junction regions 120 may be formed through an ion implantation process. For example, the junction regions 120 may be formed by ion implanting P or As which is an N type impurity into the substrate 101. Therefore, the junction regions 120 may be N type impurity regions.

Also, in the implementation, the transistor may include a diffusion region 130 which is formed to be in contact with the surface of the trench 111 and to correspond to the gate electrode 117 in the substrate 101. The diffusion region 130 may include dopants of the same materials as the dopants contained in the gate electrode 117, and may be formed by diffusing the dopants contained in the gate electrode 117 into the substrate 101. For example, when the gate electrode 117 may include tungsten containing boron, the diffusion region 130 may include the boron. The diffusion region 130 may serve as a channel region of the buried-gate 110, and may increase an effective channel length of the buried-gate 110 without physical increase of a channel length of the buried-gate 110. Also, the diffusion region 130 may increase a threshold voltage without increase of a junction leakage.

The diffusion region 130 may include a first region 131 which is formed between the gate electrode 117 and the junction regions 120 and a second region 132 which is a remaining region other than the diffusion region. Herein, the first region 131 and the second region 132 may have the same conductivity type as each other, and may have a different conductivity type from the junction regions 120. For example, the first region 131 and the second region 132 may be a P type, and the junction regions 120 may be an N type. An impurity doping concentration of the first region 131 may be less than the impurity doping concentration of the second region 132 when the amount of dopants diffused from the gate electrode 117 into the substrate 101 is a large amount sufficient to counter-dope the junction regions 120 corresponding to the first region 131. On the other hand, the first region 131 and the second region 132 may have different conductivity types from each other, and the first region 131 may have the same conductivity type as the junction regions 120. For example, the second region 132 may be a P type, and the first region 131 and the junction regions 120 may be an N type. The impurity doping concentration of the first region 131 may be less than the impurity doping concentration of the junction regions 120 when the amount of dopants diffused from the gate electrode 117 into the substrate 101 is an amount insufficient to counter-dope the junction regions 120 corresponding to the first region 131. In both of two cases described above, since the first region 131 of the diffusion region 130 having the relatively low impurity doping concentration is located in an area in which the gate electrode 117 overlaps with the junction regions 120 to the horizontal direction, the characteristic degradation due to an electric field concentration may be prevented.

As described above, in the implementation, since the transistor has the diffusion region 130 formed in the substrate to correspond to the gate electrode 117, the characteristic of the transistor may be improved.

Hereinafter, an implementation of a method for fabrication of the transistor illustrated in FIGS. 1 and 2 will be described in detail with reference to FIGS. 3A to 3D. FIGS. 3A to 3D are cross-sectional views illustrating the transistor taken along line A-A' illustrated in FIG. 1 in accordance with the implementation.

Figure 3A:
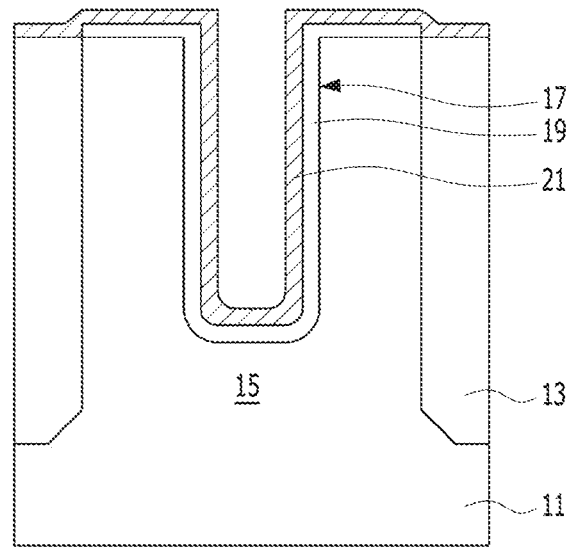
FIGS. 3A to 3D are cross-sectional views illustrating a method for fabrication of an example of a transistor in accordance with an implementation of the disclosed technology.

As illustrated in FIG. 3A, a field isolation layer 13 may be formed in a substrate 11 to define an active region 15. The field isolation layer 13 may be formed through a shallow trench isolation (STI) process. For example, the field isolation layer 13 may be formed through a series of processes of forming of a field isolation trench by etching the substrate 11 and gap-filling a dielectric material in the field isolation trench.

The trench 17 may be formed by selectively etching of the substrate 11. The trench 17 may be formed in a form which simultaneously crosses the active region 15 and the field isolation layer 13. At this time, a depth of the trench 17 formed in the field isolation layer 13 may be the same as a depth of the trench 17 formed in the active region 15, or the depth of the trench 17 formed in the field isolation layer 13 may be larger than the depth of the trench 17 formed in the active region 15.

A gate dielectric layer 19 may be formed along a structure surface including the trench 17. The gate dielectric layer 19 may be a single-layered structure including an oxide material, a nitride material, or an oxynitride material, or a multi-layered structure including two or more layers formed of the above materials. For example, the gate dielectric layer 19 may be formed of a silicon oxide layer through a thermal oxidation method.

A diffusion barrier layer 21 may be formed along the structure surface including the gate dielectric layer 19. The diffusion barrier layer 21 may be formed of a titanium nitride layer or a tungsten nitride layer. The diffusion barrier layer 21 may be formed to have a columnar structure. For example, the diffusion barrier layer 21 may be formed of the titanium nitride layer, and the titanium nitride layer having the columnar structure may be formed through a chemical vapor deposition (CVD) using titanium tetrachloride (TiCl4) and nitrogen (N2).

Figure 3B:
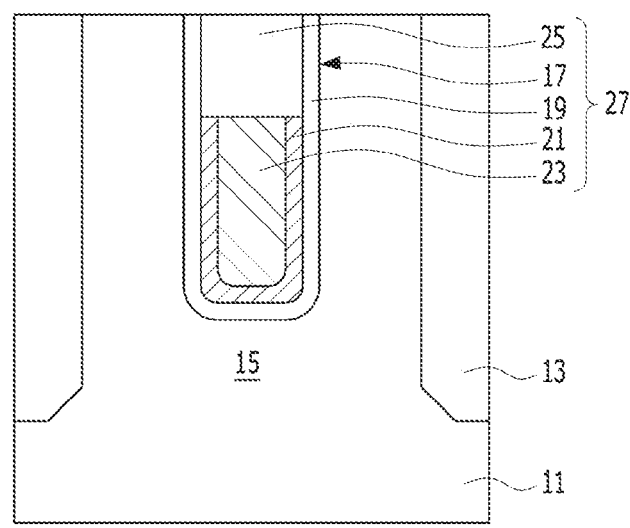

As illustrated in FIG. 3B, a gate electrode 23 which gap-fills a part of the trench 17 may be formed on the diffusion barrier layer 21. The gate electrode 23 may be formed by forming a conductive material to be gap-filled in the trench 17, and sequentially by performing a planarization process and a blanket etching process. At this time, since the a part of the diffusion barrier layer 21 is removed together with the conductive material, the diffusion barrier layer 21 may be left only between the gate dielectric layer 19 and the gate electrode 23. The planarization process may be performed through a chemical mechanical polishing method and the blanket etching process may be performed through an etch-back process.

The gate electrode 23 may be formed of the conductive material containing dopants. For example, the gate electrode 23 may be formed of tungsten containing boron. The tungsten containing the boron may be formed using diborane ($B_2H_6$) and tungsten hexafluoride ($WF_6$). At this time, a large amount of boron may remain in the gate electrode 23.

A sealing layer 25 which gap-fills the rest of the trench 17 may be formed on the gate electrode 23. The sealing layer 25 may include a dielectric material. For example, the sealing layer 25 may be a single-layered structure including any one selected from the group consisting of an oxide material, a nitride material, and an oxynitride material or a multi-layered structure including two or more thereof. A buried gate 27 may be formed through described above processes.

Figure 3C:
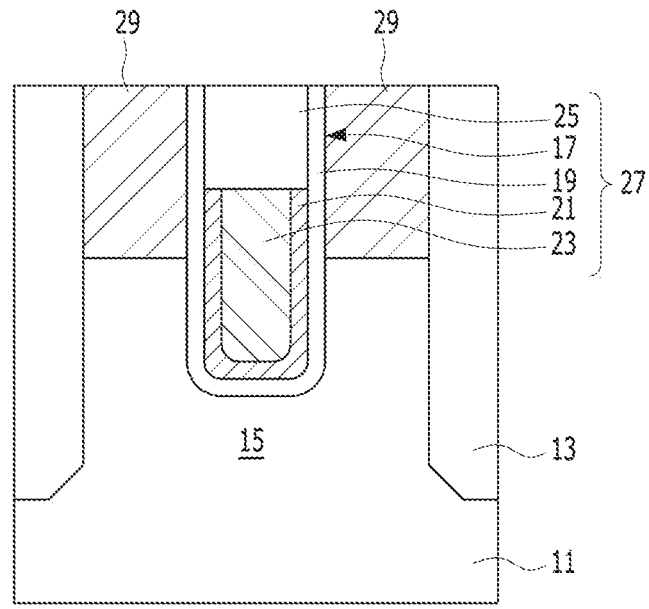

As illustrated in FIG. 3C, junction regions 29 may be formed in the substrate at both sides of the buried gate 27. The junction regions 29 may be a source region and a drain region. The junction regions 29 may be formed by ion implanting P or As which is an N type impurity into the substrate 11. The junction regions 29 may be formed to overlap a part of the gate electrode 23 to a horizontal direction. That is, a bottom surface of the junction regions 29 may be located to be lower than an upper surface of the gate electrode 23 on the basis of a surface of the substrate 11.

Figure 3D:
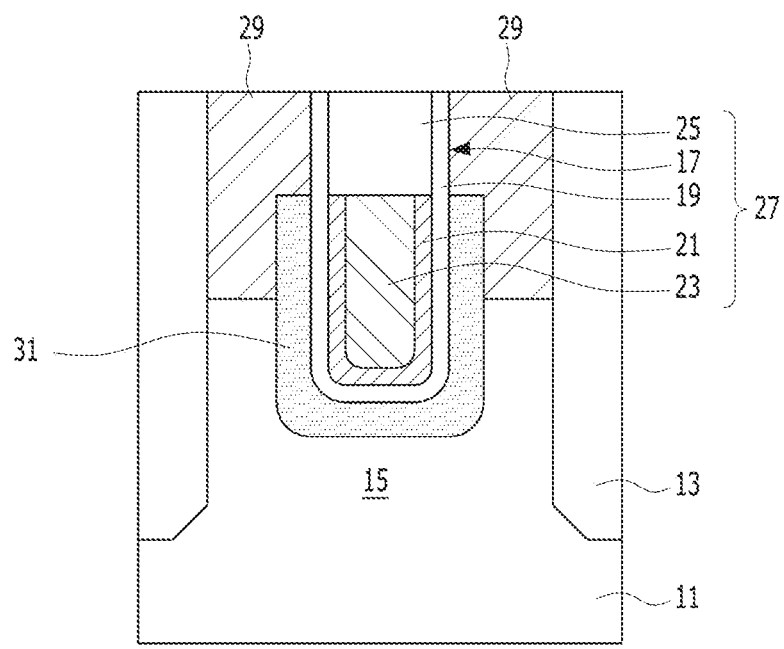

As illustrated in FIG. 3D, a diffusion region 31 corresponding to the gate electrode 23 may be formed by diffusing the dopants contained in the gate electrode 23 into the substrate 11 through an annealing process. Since the diffusion region 31 is formed using the dopants contained in the gate electrode 23 as a source, the diffusion region 31 may be formed to be in contact with the surface of the trench 17 in the substrate 11, and the diffusion region 31 may have a form to surround an outer wall of the gate electrode 23.

When the gate electrode 23 includes tungsten mixed with boron, the diffusion region 31 may be formed by diffusing of the boron into the substrate 11. That is, the diffusion region 31 may include the boron.

The transistor may be formed through described above processes in accordance with the implementation.

The transistor formed through described above processes in accordance with the implementation may be used in various electronic devices, particularly, a semiconductor memory. For example, a semiconductor memory may include a cell array which a plurality of memory cells for storing data are arranged. Each of the plurality of memory cells may include a memory element for storing data and a select element for controlling access to the memory element. A transistor formed through described above processes may be used as the select element. More particularly, the transistor may be used in the semiconductor memory which uses memory elements that exhibit different resistance states and store data data based on the resistance state. The semiconductor memory senses the resistance change in each memory element and uses the resistance state to determine the stored data, e.g., a high resistance value representing "1" and a low resistance value representing "0".

The semiconductor memory based on the resistance states for storing data may use a variable resistance element as a memory element. The variable resistance element may be an element which exhibits different resistance states and can be switched between the different resistance states in response to a current or voltage applied thereto. Such a variable resistance element may include variable resistance material that changes its resistance. The variable resistance material is used in a resistive memory that storage and erasure of information are performed by changing the resistance characteristics. The variable resistance material may be formed by various materials used in an resistive random access memory (RRAM), a phase change random access memory (PRAM), an ferroelectric random access memory (FRAM), an magnetic random access memory (MRAM), a spin transfer torque magnetic random access memory (STTRAM) and so on. For example, the variable resistance material may include a ferromagnetic material, a transition metal oxide material, a metal oxide material including a perovskite-based material, a phase change material including a chalcogenide-based material, a ferroelectric material and so on.

Figure 4:
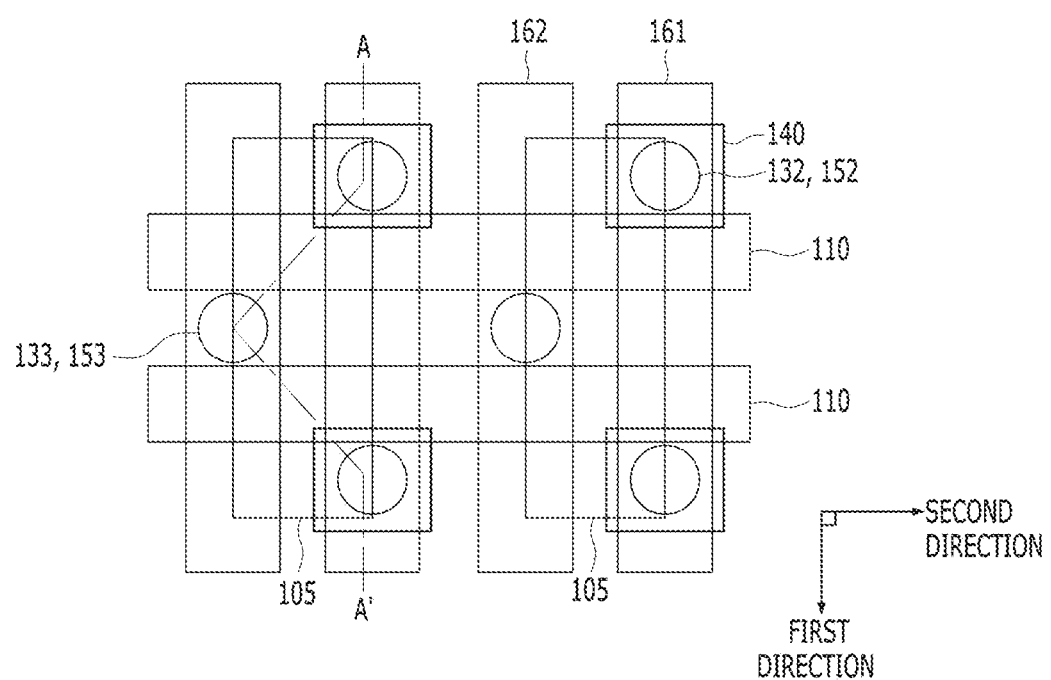
FIG. 4 is a plan view illustrating a semiconductor memory including a transistor in accordance with an implementation of the disclosed technology.
Figure 5:
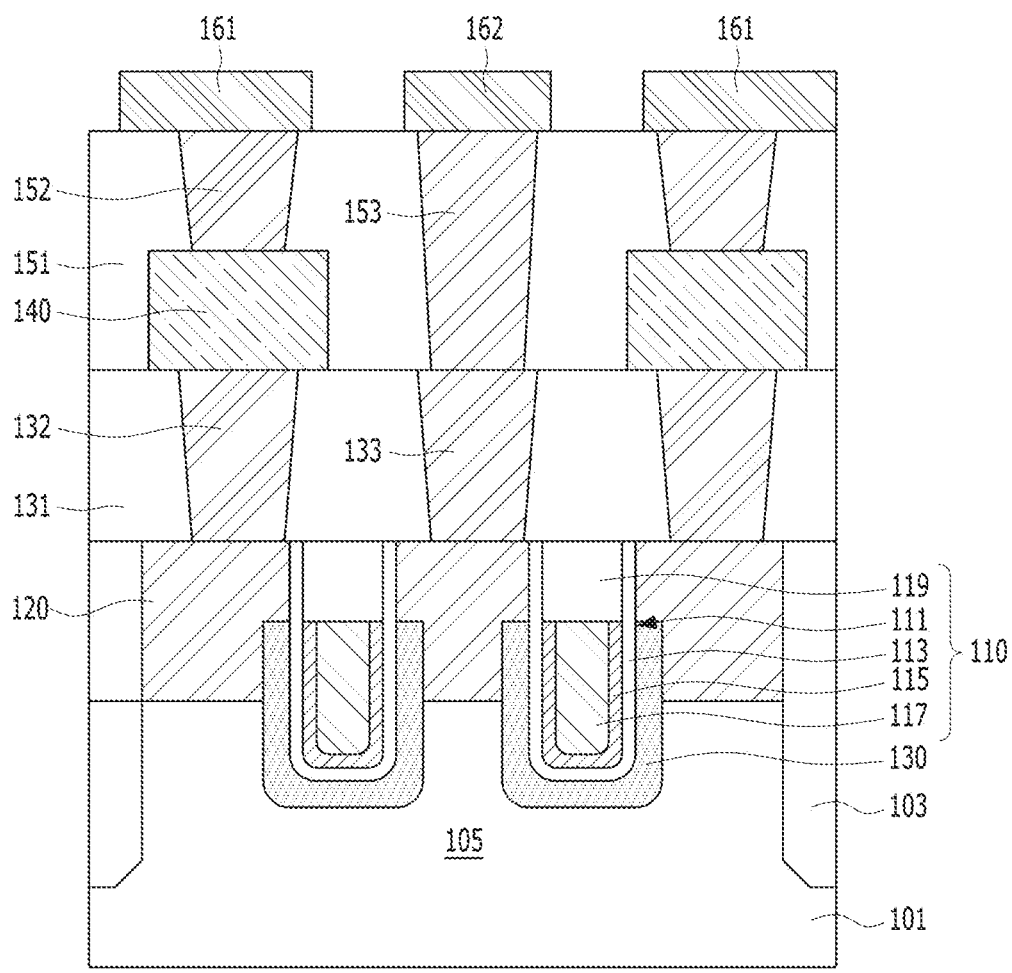
FIG. 5 is a cross-sectional view illustrating the semiconductor memory including the transistor taken along line A-A' illustrated in FIG. 4.

Hereinafter, a semiconductor memory including a transistor in accordance with an implementation is described in detail with reference to FIGS. 4 and 5. FIG. 4 is a plan view illustrating the semiconductor memory including the transistor in accordance with the implementation. FIG. 5 is a cross-sectional view illustrating the semiconductor memory including the transistor taken along line A-A' illustrated in FIG. 4 in accordance with the implementation.

As illustrated in FIGS. 4 and 5, the illustrated semiconductor memory includes an array of variable resistance elements 140, buried-gates 110 each of which is at least partially buried in the substrate 101, junction regions 120 which are formed in the substrate 101 at both sides of each buried-gate 110, and diffusion regions 130 formed in the substrate 101 to correspond to the respective buried-gates 110. As shown in FIG. 4, each active region 105 defined through a field isolation layer 103 formed in the substrate 101 may have a line type which has a long and short axis and in which the long axis extends to a first direction. A plurality of such active regions 105 may be arranged to be spaced at a predetermined interval to a second direction which crosses the first direction. Each buried-gate 110 may include a trench 111 formed in the substrate 101, a gate dielectric layer 113 formed on a surface of the trench 111, a gate electrode 117 formed on the gate dielectric layer 113 to gap-fill a part of the trench, a diffusion barrier layer 115 interposed between the gate dielectric layer 113 and the gate electrode 117, and a sealing layer 119 which gap-fills the rest of the trench 111 on the gate electrode 117. Each trench 111 may be a line type which extends to the second direction which simultaneously crosses the active region 105 and the field isolation layer 103. The transistor applicable to the semiconductor memory in accordance with the implementation has described above in detail, and thus detailed description thereof will be omitted.

Also, in the implementation, the semiconductor memory may include a first inter-dielectric layer 131 on the substrate 101, a first plug 132 which passes through the first inter-dielectric layer 131 to be coupled to the junction regions 120 at either edge of the active region 105 and a second plug 133 coupled to the junction region 120 between the buried-gates 110. The first inter-dielectric layer 131 may be a single-layered structure including any one selected from the group consisting of an oxide material, a nitride material, and an oxynitride material or a multi-layered structure including two or more thereof. The first plug 132 in the second direction may be arranged biased to one side of the active region 105, the second plug 133 in the second direction may be arranged biased on the other side of the active region 105.

Also, in the implementation, a variable resistance element 140 in the semiconductor memory may be in contact with the first plug 132 on the first inter-dielectric layer 131, a second inter-dielectric layer 151 formed on the first inter-dielectric layer 131 including the variable resistance element 140, a third plug 152 which passes through the second inter-dielectric layer 151 to be in contact with the variable resistance element 140, and a forth plug 153 which passes through the second inter-dielectric layer 151 to be in contact with the second plug 133. The second inter-dielectric layer 151 may be a single-layered structure including any one selected from the group consisting of an oxide material, a nitride material, and an oxynitride material or a multi-layered structure including two or more thereof. The variable resistance element may refer to an element which is switched between different resistance states in response to a bias (for example, current or voltage) applied thereto. The variable resistance element 140 may include a magnetic tunnel junction (MTJ) in which a tunnel barrier is interposed between two magnetic materials, a metal oxide material, a phase change material, a ferroelectric material and so on.

Also, in the implementation, the semiconductor memory may include a first conductive line 161 and a second conductive line 162 which is formed on the second inter-dielectric layer 151 to be in contact with the third plug 152 and the forth plug 153. The first conductive line 161 may be a bit line and the second conductive line 162 may be a source line. The second plug 133 and the forth plug 153 which are coupled to the second conductive line 162 may be a source line contact. The first conductive line 161 and the second conductive line 162 may be a line type pattern which extends to the first direction. The first conductive line 161 and the second conductive line 162 may be alternately arranged to be spaced at a predetermined interval to the second direction.

Since the semiconductor memory described above uses the transistor having the diffusion region 130 as the selection element, the operation characteristics and the reliability of the semiconductor memory which senses resistance change may be improved.

The semiconductor memory in accordance with the implementation of the present disclosure may be applied to diverse electronic devices or systems. FIGS. 6 to 10 show some examples of electronic devices or systems that can implement the semiconductor memory disclosed herein.

Figure 6:
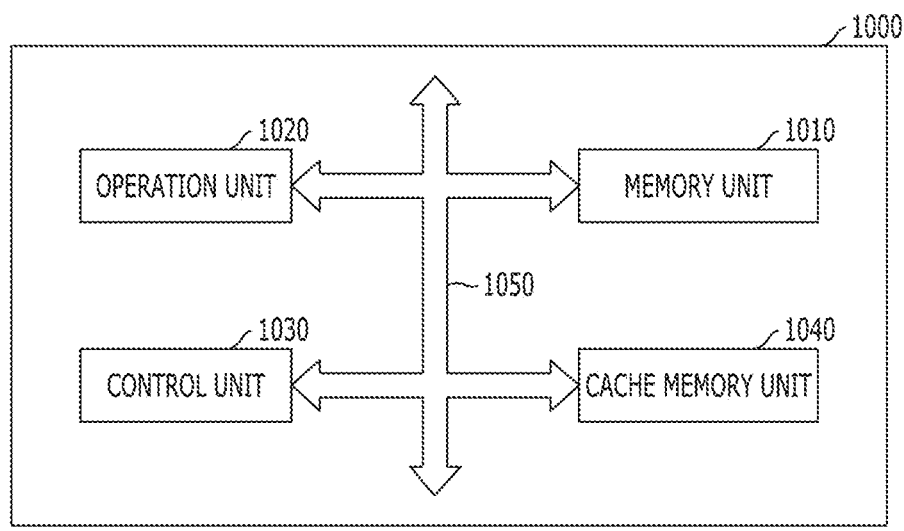
FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. The memory unit 1010 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopant contained in the gate electrode. The diffusion region may be formed by diffusing the dopants contained in the gate electrode into the substrate. By providing the diffusion region, it is possible to improve the performance of the semiconductor memory. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
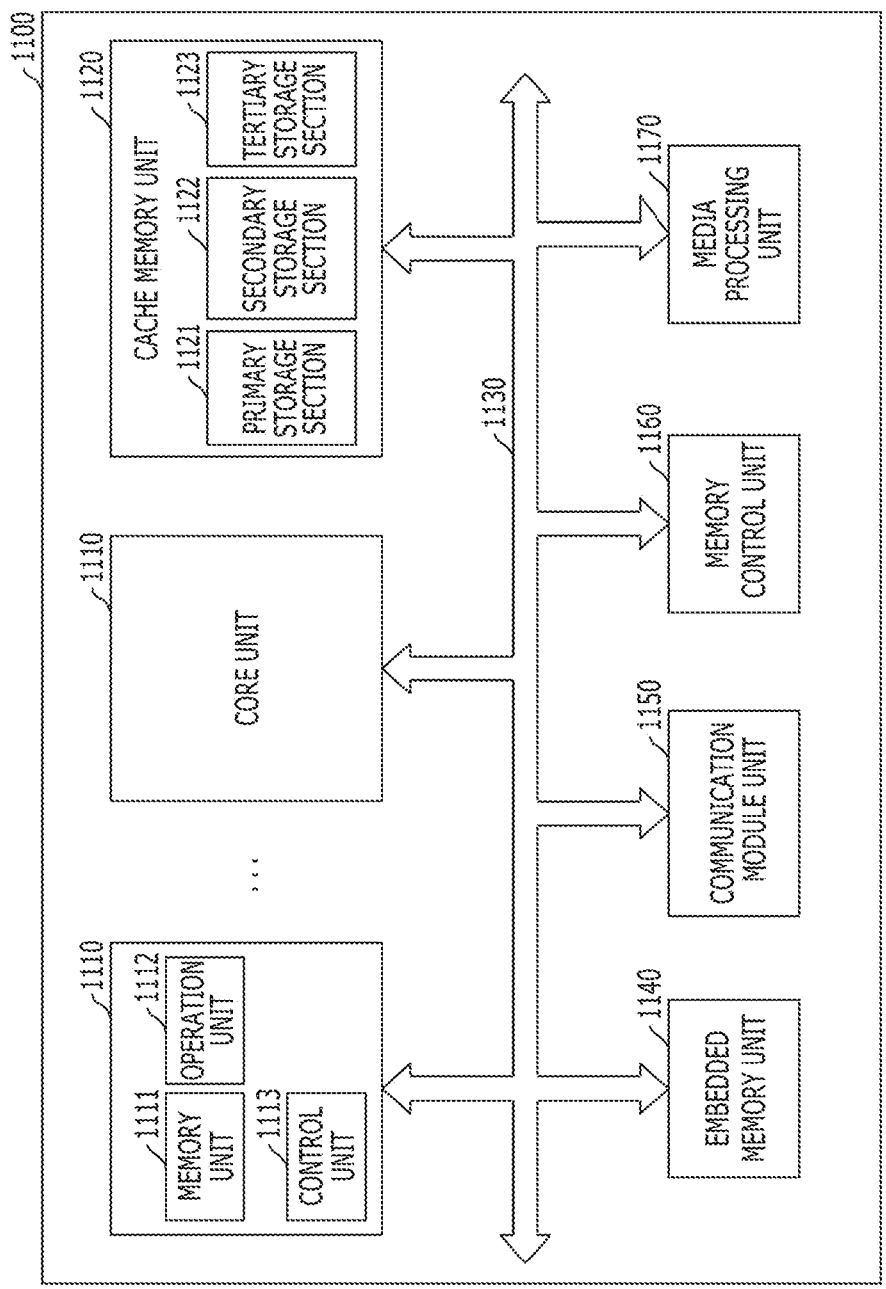
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopants contained in the gate electrode. The diffusion region may be formed by diffusing the dopants contained in the gate electrode into the substrate. By providing the diffusion region, it is possible to improve the performance of the semiconductor memory. Through this, the cache memory unit 1120 and the processor 1100 may have improved reliability.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
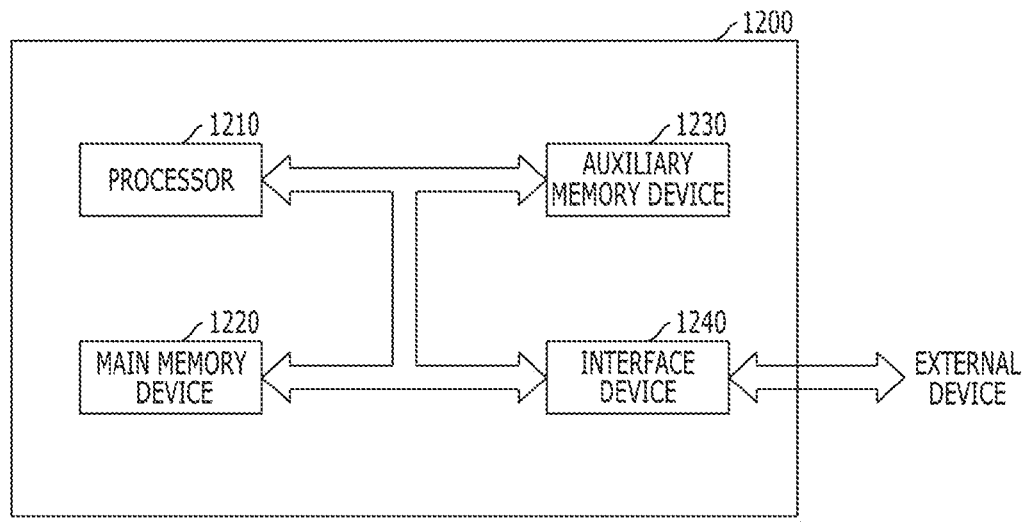
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopants contained in the gate electrode. The diffusion region may be formed by diffusing the dopants contained in the gate electrode into the substrate. By providing the diffusion region, it is possible to improve the performance of the semiconductor memory. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopants contained in the gate electrode. The diffusion region may be formed by diffusing the dopants contained in the gate electrode into the substrate. By providing the diffusion region, it is possible to improve the performance of the semiconductor memory. Through this, the auxiliary memory device 1230 and the system 1200 may have improved reliability.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
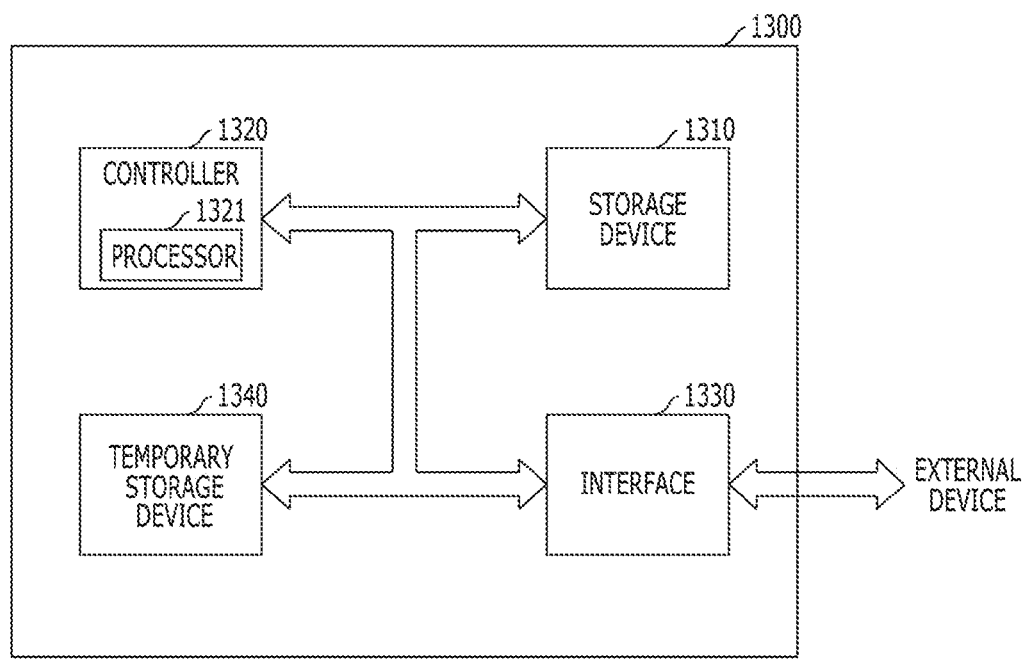
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopants contained in the gate electrode. The diffusion region may be formed by diffusing the dopants contained in the gate electrode into the substrate. By providing the diffusion region, it is possible to improve the performance of the semiconductor memory. Through this, the temporary storage device 1340 and the data storage system 1300 may have improved reliability.

Figure 10:
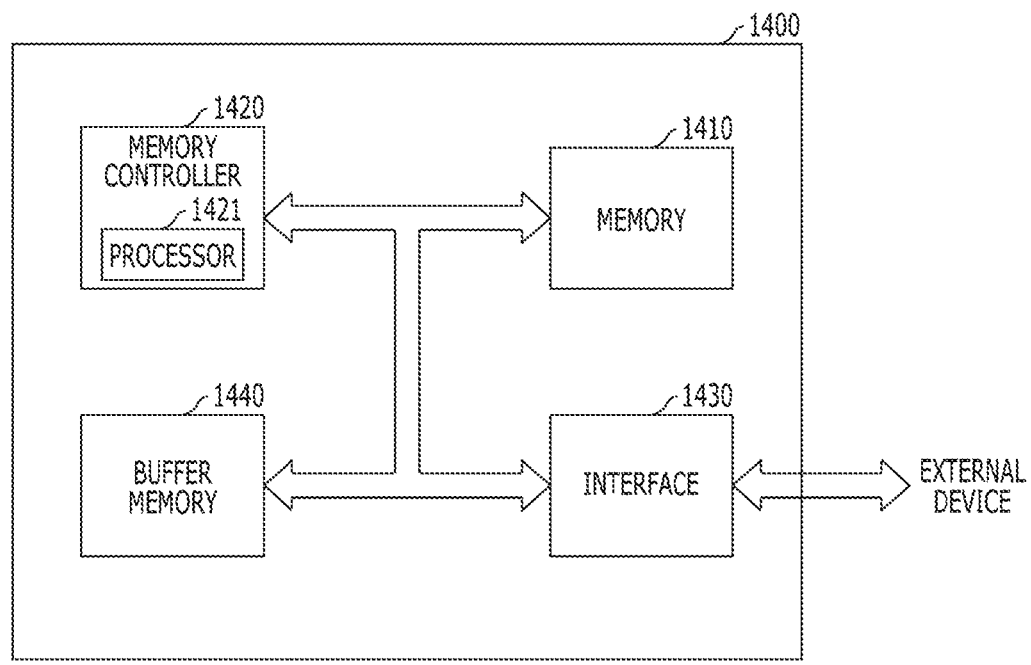
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopants contained in the gate electrode. The diffusion region may be formed by diffusing the dopants contained in the gate electrode into the substrate. By providing the diffusion region, it is possible to improve the performance of the semiconductor memory. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include semiconductor memory. The semiconductor memory may include a trench formed in a substrate; a gate dielectric layer formed on a surface of the trench; a gate electrode which is formed on the gate dielectric layer, gap-fills a part of the trench, and contains dopants; a diffusion region which is formed to be in contact with the surface of the trench and to correspond to the gate electrode in the substrate; junction regions formed in the substrate at both sides of the trench; and a memory element coupled to a junction region in a side of the trench. The diffusion region may include dopants of the same materials as the dopants contained in the gate electrode. The diffusion region may be formed by diffusing the dopants contained in the gate electrode into the substrate. By providing the diffusion region, it is possible to improve the performance of the semiconductor memory. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6 to 10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a trench formed in a substrate;
   a gate dielectric layer formed over a surface of the trench;
   a gate electrode which is formed over the gate dielectric layer, gap-fills a part of the trench, and contains dopants;
   a diffusion region which is formed to be in contact with the surface of the trench and to correspond to a location of the gate electrode in the substrate;
   junction regions formed in the substrate at both sides of the trench; and
   a memory element coupled to a junction region on a side of the trench,
   wherein the diffusion region comprises dopants of the same materials as the dopants contained in the gate electrode.

2. The electronic device of claim 1, wherein the diffusion region comprises diffused dopants through diffusion of the dopants contained in the gate electrode into the substrate.

3. The electronic device of claim 1, wherein the gate electrode includes tungsten doped with dopants containing boron.

4. The electronic device of claim 3, wherein the diffusion region comprises boron.

5. The electronic device of claim 1, further comprising:
   a diffusion barrier layer interposed between the gate dielectric layer and the gate electrode.

6. The electronic device of claim 5, wherein the diffusion barrier layer has a columnar structure.

7. The electronic device of claim 5, wherein the diffusion barrier layer comprises a titanium nitride layer or a tungsten nitride layer.

8. The electronic device of claim 1, wherein the junction regions comprises a part that overlaps with a part of the gate electrode to a horizontal direction, and
   wherein the diffusion region comprises a first region formed between the gate electrode and the junction regions, and a second region except for the first region.

9. The electronic device of claim 8, wherein conductivity types of the first region and the second region are the same as each other, and a doping concentration of the second region is greater than the doping concentration of the first region.

10. The electronic device of claim 8, wherein conductivity types of the first region and the second region are different from each other, and the conductivity types of the first region and the junction regions are the same as each other.

11. The electronic device of claim 10, wherein a doping concentration of the first region is less than the doping concentration of the junction regions.

12. The electronic device of claim 1, wherein the memory element comprises a variable resistance element which is switched between different resistance states in response to voltage or current applied thereto.

13. The electronic device of claim 12, wherein the variable resistance element comprises a magnetic tunnel junction in which a tunnel barrier is interposed between two magnetic materials.

14. The electronic device of claim 12, wherein the variable resistance element comprises a metal oxide material, a phase change material or a ferroelectric material.

15. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

16. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

17. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

18. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

19. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

\* \* \* \* \*